United States Patent
Chen et al.

(10) Patent No.: US 7,084,479 B2
(45) Date of Patent: Aug. 1, 2006

(54) LINE LEVEL AIR GAPS

(75) Inventors: Shyng-Tsong Chen, Patterson, NY (US); Stefanie Ruth Chiras, Peekskill, NY (US); Matthew Earl Colburn, Hopewell Junction, NY (US); Timothy Joseph Dalton, Ridgefield, CT (US); Jeffrey Curtis Hedrick, Montvale, NJ (US); Elbert Emin Huang, Tarrytown, NY (US); Kaushik Arun Kumar, Beacon, NY (US); Michael Wayne Lane, Cortlandt Manor, NY (US); Kelly Malone, Poughkeepsie, NY (US); Chandrasekhar Narayan, Hopewell Junction, NY (US); Satyanarayana Venkata Nitta, Poughquag, NY (US); Sampath Purushothaman, Yorktown Heights, NY (US); Robert Rosenburg, Cortlandt Manor, NY (US); Christy Sensenich Tyberg, Mahopac, NY (US); Roy RongQing Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 10/731,377

(22) Filed: Dec. 8, 2003

(65) Prior Publication Data

US 2005/0127514 A1 Jun. 16, 2005

(51) Int. Cl.
*H01L 29/00* (2006.01)
*H01L 23/48* (2006.01)
*H01L 23/52* (2006.01)
*H01L 29/40* (2006.01)

(52) U.S. Cl. ............ 257/522; 257/758; 257/21.581; 257/21.573; 257/23.013

(58) Field of Classification Search ............ 257/522, 257/21.573, 23.013, 51.581
See application file for complete search history.

(56) References Cited

U.S. PATENT DOCUMENTS

| 5,461,003 A | 10/1995 | Havemann et al. | 437/187 |
| 5,668,398 A | 9/1997 | Havemann et al. | 257/522 |
| 5,936,295 A | 8/1999 | Havemann et al. | 257/522 |
| 6,211,057 B1 | 4/2001 | Lin et al. | 438/619 |
| 6,251,798 B1 | 6/2001 | Soo et al. | 438/758 |
| 6,268,276 B1 | 9/2001 | Chan et al. | 438/619 |
| 6,287,979 B1 | 9/2001 | Zhou et al. | 438/723 |
| 6,297,125 B1 | 10/2001 | Nag et al. | 438/421 |
| 6,300,667 B1 | 10/2001 | Miyamoto | 257/522 |
| 6,316,347 B1 | 11/2001 | Chang et al. | 438/619 |
| 6,346,484 B1 | 2/2002 | Cotte et al. | 438/725 |
| 6,350,672 B1 | 2/2002 | Sun | 438/619 |
| 6,380,347 B1 | 4/2002 | Lau et al. | 528/219 |
| 6,413,854 B1 | 7/2002 | Uzoh et al. | 438/637 |
| 6,413,882 B1 | 7/2002 | Leung et al. | 438/781 |
| 6,472,719 B1 | 10/2002 | Lin et al. | 257/522 |
| 6,492,256 B1 | 12/2002 | Lee et al. | 438/619 |

(Continued)

*Primary Examiner*—Kenneth Parker
*Assistant Examiner*—Jesse A. Fenty
(74) *Attorney, Agent, or Firm*—Scully, Scott, Murphy & Presser, P.C.; Robert M. Trepp, Esq.

(57) ABSTRACT

In a multilevel microelectronic integrated circuit, air comprises permanent line level dielectric and ultra low-K materials are via level dielectric. The air is supplied to line level subsequent to removal of sacrificial material by clean thermal decomposition and assisted diffusion of byproducts through porosities in the IC structure. Optionally, air is also included within porosities in the via level dielectric. By incorporating air to the extent produced in the invention, intralevel and interlevel dielectric values are minimized.

15 Claims, 6 Drawing Sheets

U.S. PATENT DOCUMENTS

| | | | |
|---|---|---|---|
| 6,492,705 B1 | 12/2002 | Begley et al. | 257/522 |
| 6,492,732 B1 | 12/2002 | Lee et al. | 257/758 |
| 6,498,070 B1 | 12/2002 | Chang et al. | 438/421 |
| 6,577,011 B1 | 6/2003 | Buchwalter et al. | 257/758 |
| 6,596,624 B1 | 7/2003 | Romankiw | 438/619 |
| 6,635,967 B1 | 10/2003 | Liu et al. | 257/759 |
| 2004/0099951 A1* | 5/2004 | Park et al. | 257/758 |
| 2004/0147117 A1* | 7/2004 | Ngo et al. | 438/687 |
| 2005/0062165 A1* | 3/2005 | Saenger et al. | 257/774 |
| 2005/0148202 A1* | 7/2005 | Heiliger et al. | 438/778 |

* cited by examiner

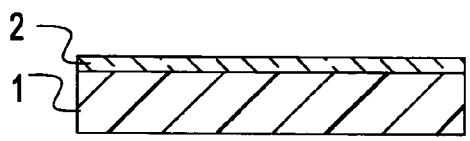
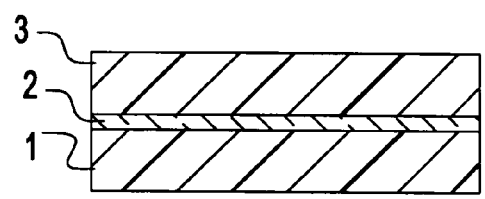
FIG.1A                FIG.1B
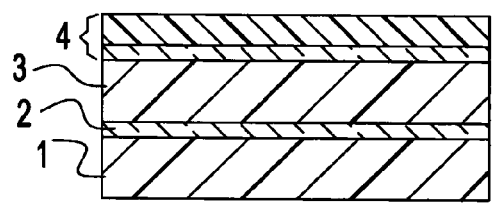
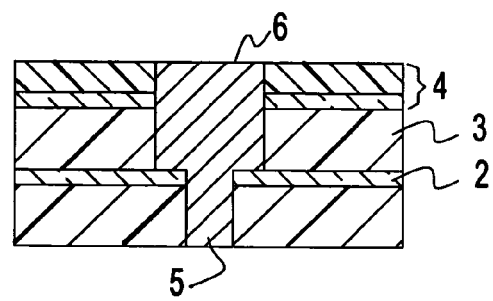
FIG.1C                FIG.1D

LINE LEVEL AIR GAPS

BACKGROUND OF THE INVENTION

The present invention relates to high density multilevel microelectronic integrated circuit (IC) structures. In particular, the present invention relates to the reduction of dielectric constant between conductive lines in each line level by providing air dielectric. A porous permanent dielectric in via levels is provided in order to optimize further the performance of the structure in a functioning device.

An aggressive drive continues toward increasing the density of features in the IC structure and toward decreasing the size of individual features. At present, feature dimensions can be fabricated to be as small as about 0.5 microns or less, and may be separated by less than 5000 Angstroms. As the drive continues, materials and processes by which the IC structure is composed must be reexamined in order to deal with problems associated with increasing proximity. A major problem with increased density is the increased intra-level interaction in capacitive voltage coupling and cross-talk between conductive lines, the largest component of which is between adjacent conductive lines in a given line level. As a result of this increased interaction, the IC is at great risk for failure at line level, in the form of unacceptably slow signal propagation, i.e. Resistance-Capacitance (R-C) delay and increased energy consumption. Interlevel interaction, while a lesser component of delay, is advisedly reduced also in order for the effective dielectric constant of the IC structure to be minimized.

The typical IC is fabricated on a semiconductor wafer substrate. Besides single crystal silicon, other potential semiconductor substrates are gallium arsenide, silicon-on-sapphire, silicon germanium, silicon-on-insulator and diamond, etc. as set forth in U.S. Pat. No. 6,251,798 B1 to Soo et al. On and/or within the substrate may be included such features as transistors, bipolar devices and diodes. Above the substrate is fabricated an IC structure comprising electrically interconnected alternating layers of vias and layers of parallel wiring lines within an insulating dielectric medium.

There is substantial prior and current art which is focused on providing the material and means of reducing the dielectric constant (K) of the insulating medium from below the approximate value 3.9 of silicon dioxide to a value which is as close as possible to the ideal value of vacuum, 1.0000, or air, 1.0002. Various low dielectric materials including fluorinated silicon dioxide, various polymers, spin-on glasses and xerogels have been explored in the current art, as for example described in U.S. Pat. No. 6,297,125 B1 to Nag et al. and in U.S. Pat. No. 6,211,057 B1 to Lin. While these materials all have low K, the value is not as low as the ideal value of air and, as described in the Nag et al. patent, each may come with its own alternate limitations when left as the wiring level dielectric.

In efforts to reduce K, air has been incorporated by various means into a dielectric matrix in the form of hollow beads, bubbles, holes or porosities. Air has also been produced in wiring levels by removing, at least partially, a solid dielectric material using an etchant. As described in the Nag et al. patent, for one example, the temporary dielectric material described is the spin-on glass (SOG) hydrogen silsequioxane (HSQ), which is removed by HF after protection of the aluminum wiring lines. Air gaps may also be incorporated as a permanent dielectric only in particular areas of an IC structure, such as shown in U.S. Pat. No. 6,316,347 B1 and B2 to Chang et al.

Some additional art directed to air dielectric is reviewed in U.S. Pat. No. 6,596,624 B1 to Romankiw, which is assigned to the same assignee as is the present invention. The Romankiw patent describes also the provision of strategically placed nonconductive vias, including at the periphery of the IC structure, and simultaneous removal of dielectric from some or all levels after joining. Another processing scheme in the art includes Etch-back Gap Fill (EBGF), U.S. Pat. No. 6,346,484.

If air gaps are to be created by only partial removal of the solid dielectric, it remains important to incorporate a low K material into the structure, especially in the wiring levels. If removal is to be complete in a level, the sacrificial material in that level need not be a dielectric. No matter how extensive the replacement of sacrificial material will be, it must be removable by a process that will not contaminate, overheat, chemically attack, mechanically distort or otherwise compromise the integrity of the structure that will remain after processing. It would be desirable to employ means that will remove the sacrificial material cleanly and thoroughly in as environmentally friendly a way as possible, in a series of reliable, efficient manufacturable process steps, compatible with microelectronics processing, to produce a robust ultra-low-K IC structure.

Several patents describe carbon as the sacrificial material and oxygen plasma or oxygen ashing as the atmosphere in which $CO_2$ is formed and then diffused away. Some examples are 6,492,256 B2 and U.S. Pat. No. 6,492,732 B2, both to Lee et al. In the Lee patents is described a dielectric liner to protect the wiring from the oxygen ashing or plasma etch. The presence of a liner on the wiring, however, risks raising the effective K. In U.S. Pat. No. 6,350,672 B1 to Sun there is no liner described. Some wiring, however, such as copper, would be attacked by oxygen ash or oxygen plasma etch.

SUMMARY OF THE INVENTION

In describing the structure and process of the present invention, the term "air dielectric" is intended to encompass vacuum, air, low-K inert gasses, forming gas and any mixtures thereof that can harmlessly replace a solid, temporary material to function as permanent dielectric.

The present invention provides a process and structure which results in a mechanically stable IC in a way that avoids processing problems experienced in the art. This result is accomplished by having air dielectric at line levels where the metallization is dense and a low-K dielectric environment is most required, in combination with low-K gas-permeable solid or porous permanent dielectric material at via levels to provide mechanical stability. The present invention does not include removal of sacrificial material by oxygen ashing or oxygen plasma etch or a reactive ambient lest the copper wiring lines be adversely affected. The present invention is directly compatible with the dual damascene process for the fabrication of copper wiring lines which is currently the state of the art.

The process of fabricating the structure of the invention includes the following exemplary steps, which take place on a semiconductor substrate on or in which there may be protected devices:

A permanent dielectric is deposited by means known in the art. A non-permeable etch stop is deposited on the surface of the solid permanent dielectric. A sacrificial material is deposited on the surface of the etch stop. A gas permeable single or dual level hard mask is deposited on the surface of the sacrificial material. After dual damascene processing and chemical metal polishing (CMP) to provide a conductive wiring level, which may be connected by via to any device below on the semiconductor level, a thin protective cap is selectively deposited on the conductive wiring.

After the via level permanent dielectric is applied on the wiring level which is selectively capped, heat is applied. The heat is applied either in vacuum atmosphere or in another controlled unreactive atmosphere at a temperature and for a time which concurrently decomposes and diffuses the sacrificial material out through the gas permeable via level dielectric, completes any necessary hard mask cure and via level permanent dielectric cure, and removes the bi-products of the heat process.

After heat treatment, a non-gas permeable etch stop is deposited on the via level and cured in order to protect the via and metallization levels from any contamination that might be generated in the sequential processing of additional layers. The process is repeated to fabricate additional via and line levels, as required. The IC of the present invention will provide Back End of Line (BEOL) interconnects with the lowest possible effective K in the line level where it has the biggest impact on RC delay, balanced with the most robust mechanical stability.

BRIEF DESCRIPTION OF THE DRAWINGS

FIGS. 1A–1Q indicate the progression of steps taken to fabricate an example of the multilevel IC structure of the present invention.

FIGS. 1A–1H show in cross-section the sequential process flow in fabricating on a semiconductor substrate (not shown) an initial stage of the IC of the present invention. FIG. 1E is an initial subset, analogous to FIG. 2A as described below.

FIGS. 1O–1Q show in cross-section, abbreviated, the result of an additional repetition of the steps shown in FIGS. 1A–1H, beginning at the top of etch stop 10' in FIG. 1N.

FIG. 2A is an initial subset of the final structure, in that the structure and processes above the substrate are repeated as needed.

DESCRIPTION OF THE PREFERRED EMBODIMENTS

Figure 1E:
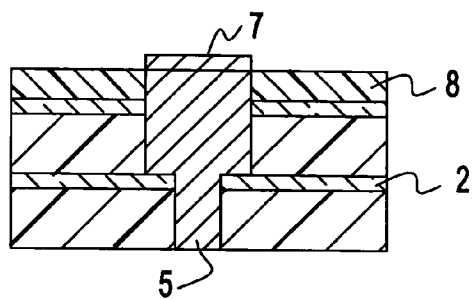

FIG. 1A shows the initial fabrication steps on the top surface of a semiconductor substrate (not shown) of an IC structure of the present invention. The first layer of a solid permanent ultra-low-K dielectric material 1 has been deposited on the substrate for patterning of the first via level. Examples of suitable porous and substantially non-porous gas permeable materials used to function as the solid permanent low-K dielectric at via levels include: porous SiLK and SiLK, a polymer product of Dow Chemical Company, which is applied as a spin-coated oligomeric solution and cured at about 400° C.–450° C.; porous SiCOH and SiCOH, a glassy spin-on material such as JSR, a product of JSR Micro; and methyl silsesquioxane (MSSQ). A first gas impermeable etch stop layer 2 has been deposited on the layer of permanent dielectric material 1 by means known in the art, such as spin-on, chemical vapor deposition (CVD) and the like. Examples of suitable materials used to function as the etch stop include: $SiO_2$; SiN; SiC; SiCH; and SiNCH. This etch stop layer may or may not be necessary, depending on whether impermeability or permeability is appropriate to the materials used in a particular situation.

It should be noted that the permanent dielectric material selected should not be decomposable at a temperature near or below the temperature at which the sacrificial dielectric material is decomposed, unless air dielectric is desired for both via levels and line levels. However, if the permanent dielectric material is of a type that forms or maintains porosities while the sacrificial dielectric material is removed, the K value can be further reduced.

In FIG. 1B the first layer of sacrificial material 3 has been deposited on etch stop layer 2 by means known in the art for the material selected. It is coated with a single or double-layer hard mask 4 as shown in FIG. 1C. The sacrificial material may be, but need not be, a dielectric; it need be a material that will cleanly decompose within a time and temperature range, and in an atmosphere, which will not adversely affect the function of other structural components. An acceptable decomposition temperature would be at or about 350° C.–450° C. Examples of suitable materials to function as a sacrificial layer include: polystyrenes; polymethyl methacrylates; polynorbornenes; and polypropylene glycols. Cross linking of the organics by UV or electron beam exposure has the benefit of rendering those temporary dielectric layers insoluble to organic solvents used during processing. Polynorbornene is available as a product named Unity. Examples of suitable materials to function as a permeable hard mask include: HoSP and HoSP Best, products of Honeywell Electronic Materials; JSR 5140, JSR 2021, products of JSR Micro; SiCOH, polycarbonate or combinations of any of these materials, optionally arranged as a bi-layer. A sacrificial dielectric material can be used as a CMP hard mask at line level if the material has a very low CMP removal rate.

After dual Damascene processing is performed to provide conductive via 5 within permanent dielectric 1 and wiring 6 within sacrificial layer 3 as shown in FIG. 1D, and after chemical metal polishing (CMP) is performed to planarize and to expose the top surface of wiring 6, protective cap 7, shown in FIG. 1E, is selectively deposited on exposed wiring 6, which is preferably copper. Dual Damascene processing is known in the art. Alternatively, copper wiring 6 can undergo a recess process, blanket deposition of cap 7 material, and CMP planarization. Examples of suitable materials to function as a cap include: CoWP, Ta, W, TaN, Ru, and any combinations thereof, such as alloys or bilayers.

Figure 1F:
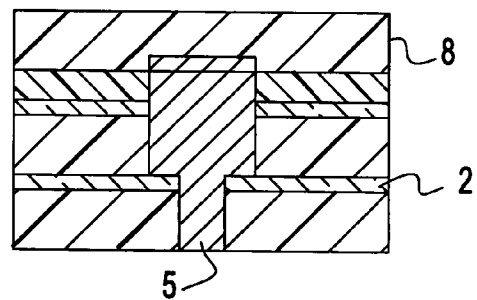
Figure 1G:
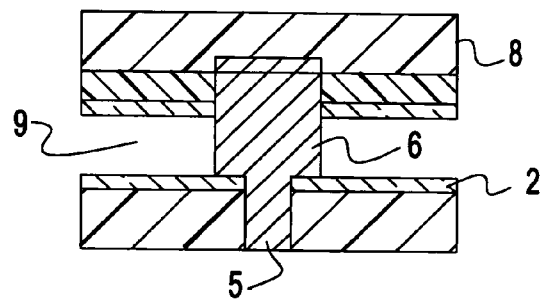
Figure 1H:
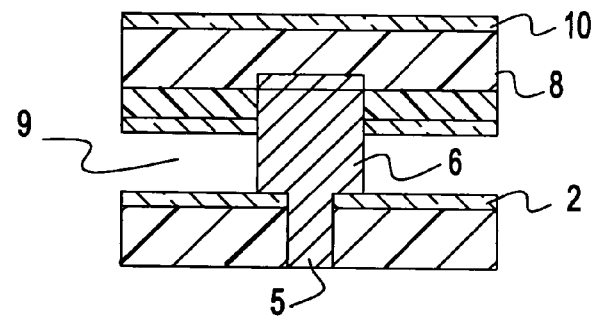

A blanket layer of permanent dielectric material 8 is then deposited on the wiring level as shown in FIG. 1F, and the entire structure undergoes anneal in a furnace having controlled, inert or vacuum atmosphere. The increase in temperature is slowly ramped to about 350° C.–450° C. for a time sufficient to complete removal of the sacrificial dielectric and its decomposition by-products. The end point may be monitored using a mass spectrometer. The effect of anneal is shown in FIG. 1G, wherein the sacrificial material 3 has decomposed, leaving air dielectric 9 in its place. The decomposition byproducts are gassified and diffuse through permeable hard mask 4 and dielectric 8 and are removed by vacuum. Etch stop 2 prevents diffusion of decomposition byproducts from entering metallization levels below etch stop 2. A layer of etch stop 10, shown in FIG. 1H, is then deposited to seal the layers below and to serve as the base, as did etch stop 2 in FIG. 1A, for sequentially fabricating additional robust multilevel structure as shown in FIGS.

Figure 1I:
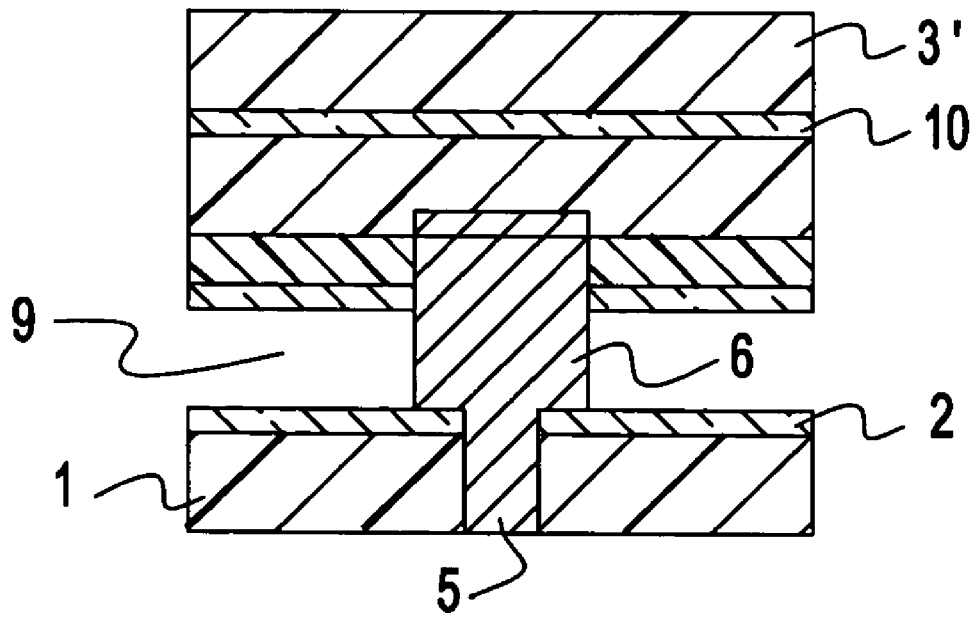
FIGS. 1I–1N show in cross-section the result of a single repetition of the steps shown in FIGS. 1A–1H, beginning at the top of etch stop 10 in FIG. 1H.
Figure 1J:
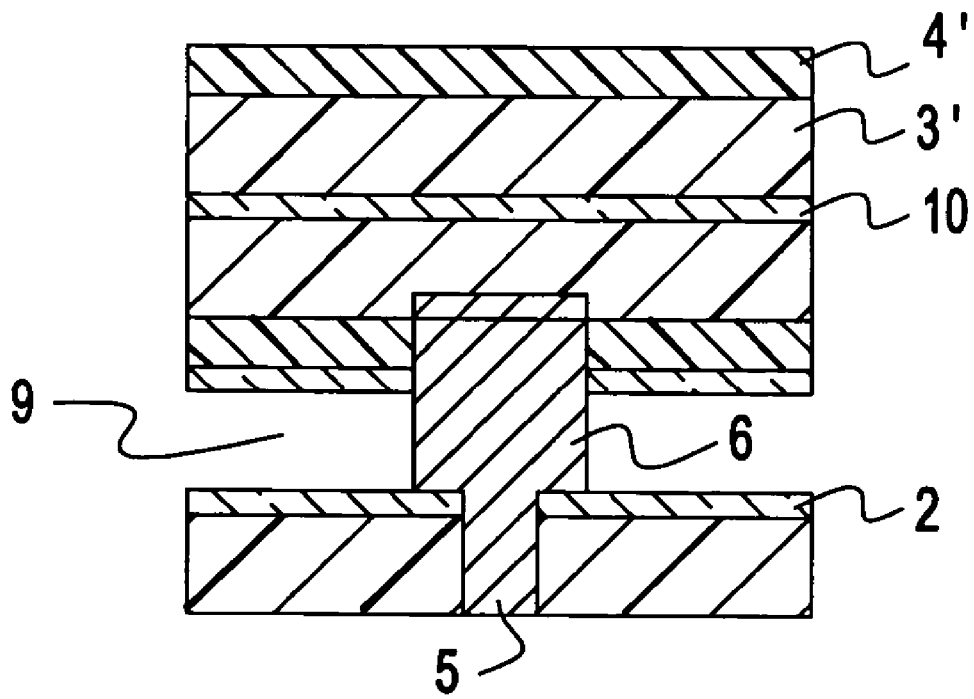
Figure 1K:
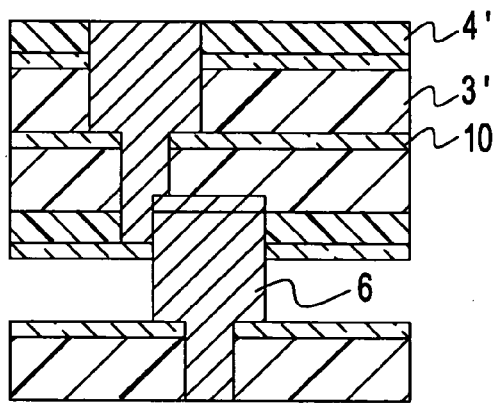
Figure 1L:
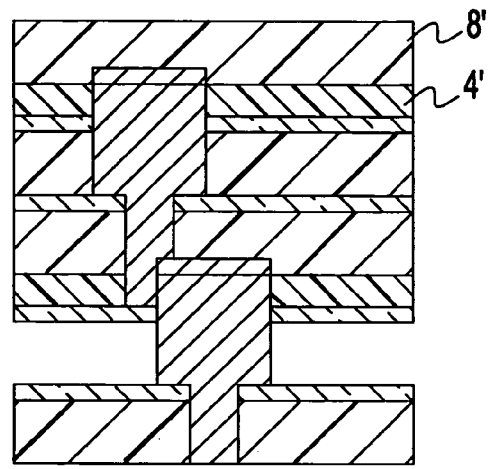
Figure 1M:
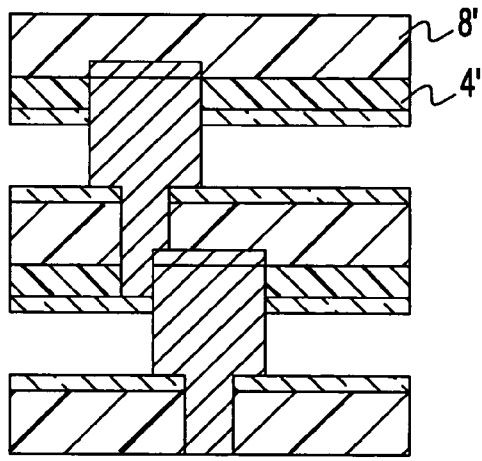
Figure 1N:
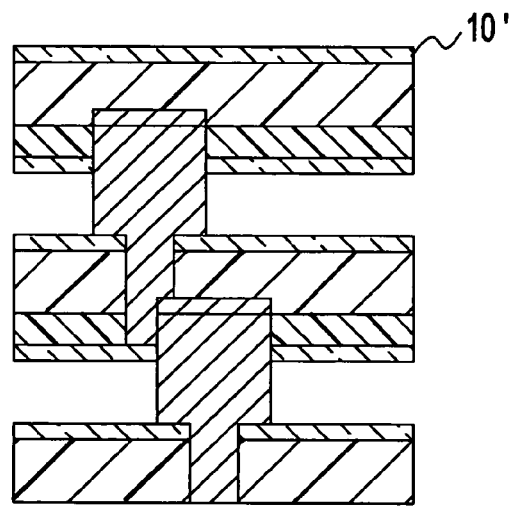
Figure 1O:
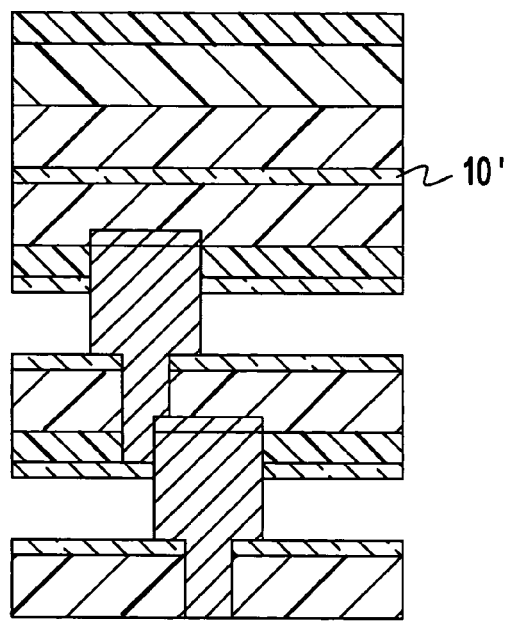
Figure 1P:
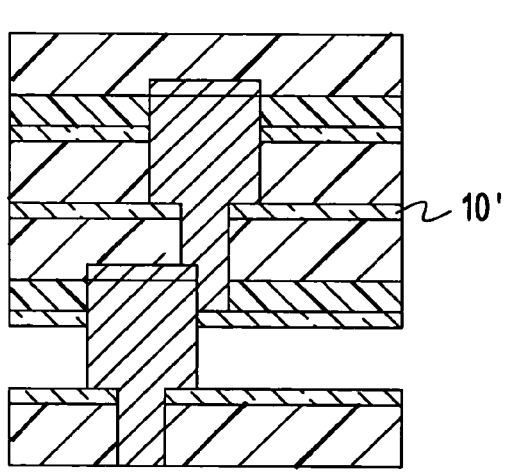
Figure 1Q:
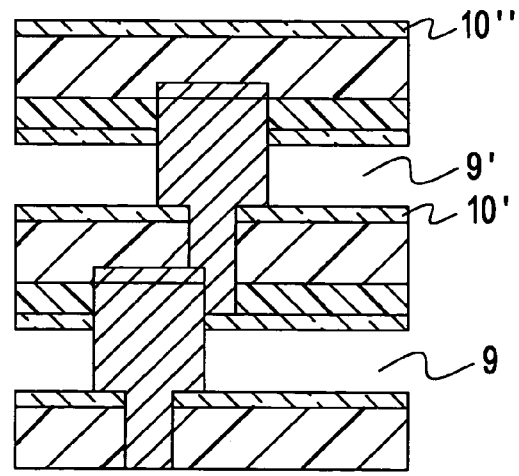

1I–1N, repeating the fabrication sequence as many times as necessary to obtain the structure desired, as represented further in abbreviated FIGS. 1O–1Q, fabricated on top of etch stop 10' fabricated as shown in FIG. 1N. Note that 3' represents the sacrificial layer fabricated as shown in FIG. 1I, 4' represents the hard mask fabricated as shown in FIG. 1J, 8' represents the dielectric fabricated as shown in FIG. 1I, and 10" represents the etch stop fabricated as shown in FIG. 1Q.

Figure 2A:
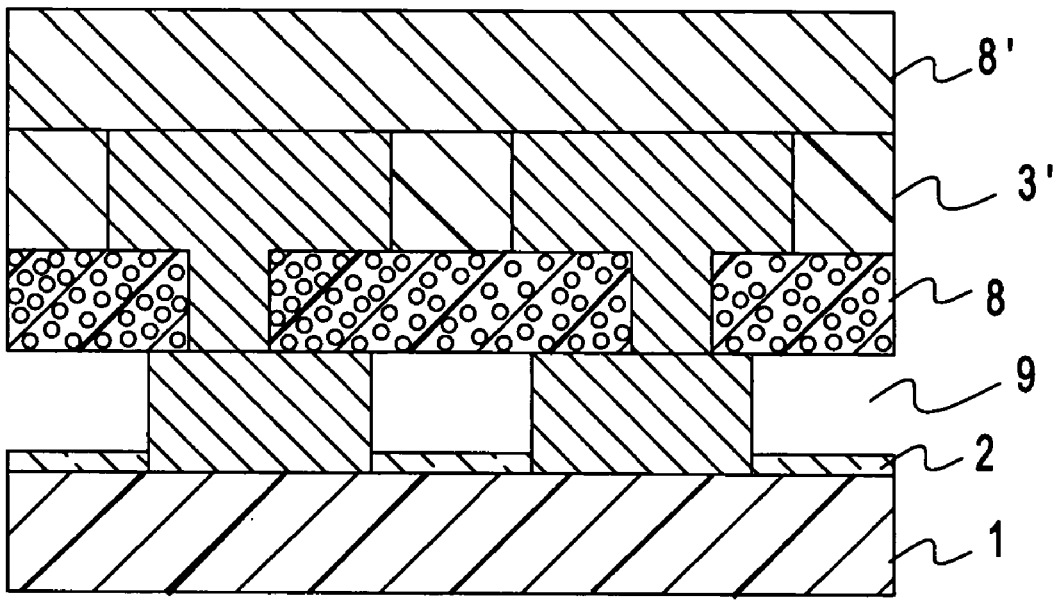
FIGS. 2A and 2B provide an example of an intermediate structure of the present invention in which the via level incorporates a permanent low-K material which becomes filled with porosities when cured.
Figure 2B:
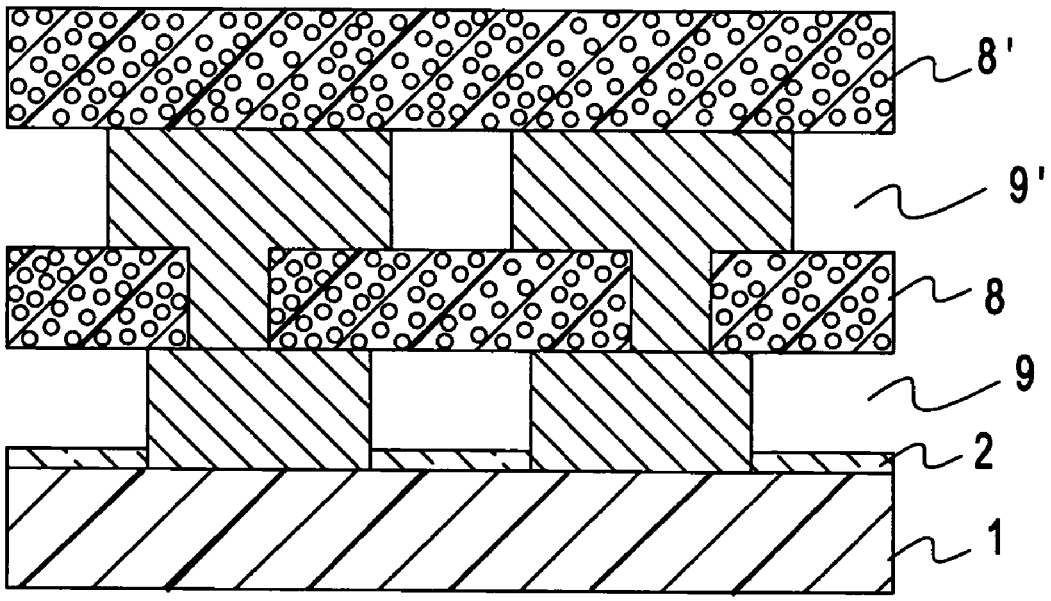

In FIGS. 2A and 2B permanent ultra-low-k dielectric material 8 and 8' is shown. As deposited, the material shown is substantially without porosities. During heating and removal of the sacrificial dielectric, the permanent dielectric is finally cured, revealing a highly porous structure. The IC structure in progress is shown being fabricated on an FEOL substrate. A CMP hard mask, not shown in the drawings, is optionally present as a single layer or bi-layer between a sacrificial material level (a.k.a. line level) and a permanent dielectric level.

Starting with the process step underway in FIG. 2A, low-k permanent dielectric 8' and sacrificial material 3' a second such process removes sacrificial material 3', leaving air level 9' and adding porosities throughout via level 8'. The process can be repeated many times, as necessary. Combining the via level porous permanent solid dielectric with the gaseous permanent line level dielectric further lowers the effective K of the IC structure and provides a BEOL interconnect structure with a minimal effective dielectric constant.

We claim:

1. A semiconductor device structure, comprising atop an FEOL semiconductor substrate:
   a. a copper via level in electrical communication with the FEOL substrate and comprising also a solid permanent low-K dielectric material;
   b. a gas impermeable etch stop level atop the permanent dielectric;
   c. a permanent air dielectric level atop the etch stop;
   d. a gas permeable hard mask atop the air dielectric level;
   e. copper wiring having a top surface at the hard mask level and being in electrical communication with the via level; and
   f. a thin protective cap on the top surface of the copper wiring.

2. A semiconductor device structure comprising a plurality of levels a–f recited in claim 1.

3. The structure recited in claim 2, wherein the solid permanent low-K dielectric material.

4. The structure recited in claim 3, wherein the porous solid permanent low-K dielectric material is selected from the group consisting of porous SiLK, porous SiCOH and porous MSSQ. comprises a porous solid permanent low-K dielectric material.

5. The structure recited in claim 2, wherein the solid permanent low-K dielectric material comprises a gas permeable solid permanent low-K dielectric material.

6. The structure recited in claim 5, wherein the gas permeable solid permanent low-K dielectric material is selected from the group consisting of SiLK, SiCOH, MSSQ, and JSR.

7. The structure recited in claim 2, wherein between a minority of the total number of air dielectric levels and via levels comprise also a strengthener.

8. The structure recited in claim 2, wherein the hard mask layer is selected from the group consisting of $SiO_2$, SiN, SiC, SiCH and SiNCH.

9. The structure recited in claim 8, wherein the hard mask layer is bi-layer, each layer of the bi-layer being selected from a different one of the group consisting of $SiO_2$, SiN, SiC, SiCH and SiNCH.

10. The structure recited in claim 2, wherein the cap is selected from the group consisting of CoWP, Ta, W, TaN, Ru and any combination thereof.

11. An initial subset for a semiconductor device structure, comprising atop an FEOL semiconductor substrate:
   a. a gas impermeable etch stop level atop the substrate;
   b. a first copper line level in electrical communication with the FEOL substrate, the first line level also comprising a permanent air dielectric material atop the etch stop;
   c. a first copper via level atop and in electrical communication with the first copper line level, the first via level also comprising a first permanent porous ultra-low dielectric material;
   d. a second copper line level in electrical communication with the first via level, the second line level also comprising a sacrificial material which is subject to decomposition and removal under process heating; and
   e. atop the second line level, a layer of permanent ultra-low dielectric material which is subject to forming porosities under process heating.

12. The structure recited in claim 11, wherein the permanent ultra-low dielectric material which is subject to forming porosities under process heating is selected from the group consisting of porous SiLK, porous SiCOH and porous MSSQ.

13. The structure recited in claim 11, wherein the sacrificial material which is subject to decomposition and removal under process heating is selected from the group consisting of polystyrenes; polymethyl methacrylates; polynorbornenes; and polypropylene glycols.

14. The structure recited in claim 11, comprising also a hard mask layer between line level and via level.

15. The structure recited in claim 14, wherein the hard mask layer is selected from the group consisting of $SiO_2$, SiN, SiC, SiCH and SiNCH.

* * * * *